United States Patent
Iida et al.

(10) Patent No.: US 7,390,361 B2
(45) Date of Patent: Jun. 24, 2008

(54) SEMICONDUCTOR SINGLE CRYSTAL MANUFACTURING APPARATUS AND GRAPHITE CRUCIBLE

(75) Inventors: Tetsuhiro Iida, Kanagawa (JP); Akiko Noda, Kanagawa (JP); Junsuke Tomioka, Kanagawa (JP)

(73) Assignee: Sumco Techxiv Corporation, Nagasaki (JP)

( * ) Notice: Subject to any disclaimer, the term of this patent is extended or adjusted under 35 U.S.C. 154(b) by 0 days.

(21) Appl. No.: 10/594,175

(22) PCT Filed: Mar. 31, 2005

(86) PCT No.: PCT/JP2005/006321
§ 371 (c)(1),
(2), (4) Date: Sep. 26, 2006

(87) PCT Pub. No.: WO2005/095680
PCT Pub. Date: Oct. 13, 2005

(65) Prior Publication Data
US 2007/0215038 A1 Sep. 20, 2007

(30) Foreign Application Priority Data
Mar. 31, 2004 (JP) ............................. 2004-105341

(51) Int. Cl.
*C30B 35/00* (2006.01)
(52) U.S. Cl. .................. 117/217; 117/218; 117/219; 117/222; 219/424; 219/426; 373/130
(58) Field of Classification Search ............... 117/217, 117/218, 219, 222; 219/424, 426; 373/130
See application file for complete search history.

(56) References Cited

U.S. PATENT DOCUMENTS

| 5,363,796 | A  | * | 11/1994 | Kobayashi et al. ............ 117/30 |
| 5,766,347 | A  | * | 6/1998  | Shimomura et al. ......... 117/217 |
| 5,968,266 | A  | * | 10/1999 | Iino et al. .................... 117/217 |
| 6,285,011 | B1 | * | 9/2001  | Cherko ........................ 219/426 |
| 6,355,910 | B1 | * | 3/2002  | Seidl et al. .................. 219/426 |
| 6,562,134 | B1 | * | 5/2003  | Maeda et al. ............... 117/222 |

FOREIGN PATENT DOCUMENTS

| JP | 62-153191  | 7/1987  |
| JP | 02-217388  | 8/1990  |
| JP | 05-070276  | 3/1993  |
| JP | 09-263484  | 10/1997 |
| JP | 2001-039792 | 2/2001  |
| JP | 2001-270797 | 10/2001 |

* cited by examiner

*Primary Examiner*—Felisa C Hiteshew
(74) *Attorney, Agent, or Firm*—Welsh & Katz, Ltd.

(57) ABSTRACT

A semiconductor single crystal manufacturing apparatus which can manufacture a single crystal of high oxygen concentration to that of low oxygen concentration within a prescribed standard range of oxygen concentration, as a wafer material for semiconductor integrated circuits, with a high yield, is provided. Heat shields 20, 21 are provided in the entire annular area between respective adjacent heaters of the heaters 4a, 4b, 4c for heating the crucible 3 from the outside periphery side. By using the heat shields 20, 21 for localizing the respective heating regions for the heaters to actively control the temperature distribution for the crucible 3 and melt 8 in the crucible, a single crystal of high oxygen concentration to that of low oxygen concentration can be manufactured within a prescribed standard range of oxygen concentration with a high yield.

11 Claims, 7 Drawing Sheets

SEMICONDUCTOR SINGLE CRYSTAL MANUFACTURING APPARATUS AND GRAPHITE CRUCIBLE

TECHNICAL FIELD

The present invention relates to a semiconductor single crystal manufacturing apparatus for a silicon single crystal or the like, which provides a material for a semiconductor wafer, and particularly, relates to the semiconductor single crystal manufacturing apparatus using a Czochralski method.

BACKGROUND ART

For semiconductor integrated circuits, a silicon wafer having a prescribed oxygen concentration is required to provide a protection against heavy metal contamination or to improve the various types of quality and the yield, and the silicon single crystal, which is a material for such a silicon wafer, can be manufactured with a single crystal manufacturing apparatus using the Czochralski method (hereinafter referred to as CZ apparatus).

With this CZ apparatus, a raw material for single crystal is filled into a crucible disposed inside a chamber, and inert purge gas is introduced into the chamber, while this raw material is heated and melted with a heater provided outside the crucible. After a seed crystal having thoroughly stuck into this molten melt, the seed crystal is pulled up, while being rotated, in order to grow a single crystal at the lower end of the seed crystal.

Most of the amount of oxygen in the silicon single crystal manufactured by using the above-mentioned CZ apparatus is supplied from the quartz used as the material for the crucible.

In other words, at a contact surface where the silicon melt and the inside surface of the crucible are contacted with each other at high temperature, the quartz ($SiO_2$) in the crucible material always reacts with the silicon (Si) in the melt, and from the crucible surface, volatile silicon oxide (SiO) is eluted into the melt as eluted oxygen. This eluted oxygen is evaporated from the melt surface as volatile SiO, while the eluted oxygen is stirred by the forced convection of the melt due to the rotation of the crucible, the thermal convection due to the temperature distribution in the crucible and the melt in the crucible (hereinafter referred to as temperature distribution in crucible), and the like, a part thereof being transported to the growth interface of the single crystal which is being pulled up, and taken into the single crystal.

By the way, during actual manufacture of the silicon single crystal, the amount of oxygen taken in into the single crystal is complicatedly relates to various manufacturing conditions, such as the SiO reaction speed, the purge gas conditions, the remaining amount of the melt, the heating conditions of the heater, and the like, thus it is considerably difficult to manufacture the single crystal within a prescribed oxygen concentration with a high yield.

Then, conventionally, as the method for controlling the oxygen concentration in a silicon single crystal, the method which pays attention to the relation between the rotational speed of the crucible and the oxygen concentration in the melt; the method which heeds the relation between the pressure, flow rate, flow velocity conditions of the purge gas and the amount of evaporated SiO; the method which pays heed to the applied magnetic field in the crucible and the oxygen concentration in the melt; and the like, have been proposed and implemented.

Further, in the patent literatures 1 to 4, as a promising method for controlling the oxygen concentration that can replace the above-mentioned methods, the method and the apparatus, as outlined below, which use a plurality of heaters to control the above mentioned "temperature distribution in crucible", thereby controlling the oxygen concentration in the silicon single crystal being pulled up, is disclosed.

Patent literature 1 discloses an apparatus wherein a plurality of heaters are vertically provided in steps along the side periphery of the crucible, and according to the state of progress of single crystal pulling up, electric power is appropriately supplied to each of these heaters, whereby the amount of eluted oxygen and the oxygen elution region are appropriately controlled to hold the oxygen concentration in the single crystal to within a prescribed range. This method features that, during the first half of the single crystal manufacturing process, the melt at the crucible bottom is solidified for a while to control the amount of eluted oxygen from the bottom of the crucible.

Patent literature 2 discloses a method for manufacturing the single crystal having the targeted oxygen concentration with a high yield through suppressing the amount of eluted oxygen at the crucible bottom, by vertically providing a plurality of heaters in steps along the side periphery of the crucible, and maintaining the level of the surface of the melt to within the heating region for the top heater, while setting the ratio of the output of the top heater to that of all the heaters at a prescribed value or higher, and always holding the temperature at the crucible bottom to below the temperature at the crucible upper portion.

Patent literature 3 discloses a method of manufacturing the single crystal using an apparatus having a shield member for finely controlling the oxygen concentration in the single crystal silicon, by independently controlling the outputs of a plurality of heaters provided along the side periphery and the bottom of the crucible, thereby suppressing the high temperature region in the melt from being shifted toward the high temperature side by the above-mentioned shield member.

Patent literature 4 discloses an invention for controlling the oxygen concentration in the silicon single crystal by vertically providing heaters at three-stages along the side of the quartz crucible, varying the electrical resistance for the respective heaters, and supplying electric power to the respective heaters from a common power supply, thereby varying the amount of heat generated in the respective heaters.

Patent literature 1: Japanese Patent Application Laid-Open No. 62-153191
Patent literature 2: Japanese Patent No. 3000923
Patent literature 3: Japanese Patent No. 2681115
Patent literature 4: Japanese Patent Application Laid-Open No. 2001-39792

DISCLOSURE OF THE INVENTION

Problems to Be Solved by the Invention

By the way, in recent years, with the semiconductor integrated circuit having been increasingly diversified, the demand for a silicon wafer having a further wider range of oxygen concentration than that which has been conventionally requested has been enhanced, thus the need for a CZ apparatus which can produce a silicon single crystal meeting such a specification at low cost has been increased.

In such situation, when using a method which utilizes the relationship between the above-mentioned rotational speed and the oxygen concentration in the melt and the method utilizing the purge gas conditions, there arises a problem that the range for controlling oxygen concentration is too narrow, thus the silicon single crystal of the above-mentioned wide oxygen concentration range cannot be manufactured with a good yield. When using a method utilizing the magnetic field generator, there occurs a problem that the apparatus is expensive, and requires a considerable installation space, and further the maintenance cost is high, thus a silicon single crystal cannot be manufactured inexpensively.

In addition, the inventions as given in the above-mentioned four literatures can solve the problems presented by the above-mentioned methods to some extent, however, it has been found that they are unsatisfactory for manufacturing a silicon single crystal of the wide oxygen concentration range which has been requested at present, with a high yield.

When using an apparatus which utilizes a plurality of heaters, in order to manufacture a silicon single crystal of the above-mentioned wide oxygen concentration range with a high yield, it is an essential key to actively control the "temperature distribution in crucible" for generating eluted oxygen at a prescribed site by a prescribed amount, and transporting this eluted oxygen to a prescribed region with a thermal convection adequately formed.

However, in any of the inventions as given in the above-mentioned literatures, each of the heating regions of each of the heaters that are adjacently located overlaps each other, and if the outputs of the respective heaters are independently changed, the "temperature distribution in crucible" cannot be actively applied, thus it is difficult to carry out a precise control over a wide oxygen concentration range for manufacturing a silicon single crystal with a high yield.

For example, in the method as given in the above-mentioned patent literature 4, the resistance value for a particular heater is varied for varying the amount of generated heat in the particular heater, and the range of change in the temperature distribution along the direction of growth of the single crystal silicon is determined by the height of the individual heaters and the number of heaters, and the "temperature distribution in crucible" cannot be greatly changed. Therefore, the range for controlling oxygen concentration in the single crystal silicon is not sufficiently wide, and the yield of a semiconductor product is not satisfactory.

The present invention has been made in view of the above-mentioned problems, and the purpose thereof is to provide a semiconductor single crystal manufacturing apparatus which, in using a plurality of heaters for controlling the oxygen concentration in the single crystal silicon, localizes the heating regions for the plurality of vertically adjacent heaters, and obtains the temperature distribution in the crucible and the melt in the crucible with a good controllability, thereby allowing a single crystal with a high oxygen concentration to that with low one to be manufactured within a prescribed standard range of oxygen concentration with a good yield, and yet which is inexpensive.

Means to Solve the Problems

In order to achieve the purpose as stated above, a first invention provides a semiconductor single crystal manufacturing apparatus using the Czochralski method comprising a crucible for pooling melt of a raw material of a semiconductor single crystal, and a plurality of heaters vertically disposed outside the crucible for heating and melting the raw material, wherein a heat shield is provided in a space between the crucible and a substance which is disposed outside the plurality of heaters, the substance facing the plurality of heaters, or in the vicinity of that space, each of the heaters is independently supplied with electric power, and the heat shield is provided in a location in the vicinity of an area where an amount of generated heat is relatively low among generated heat distribution by all of the heaters.

A second invention provides the first invention, wherein the area where an amount of generated heat is low is provided by, for a heater located on an upper side, adjusting a resistance value for heater respective portions such that the amount of generated heat in a heater lower portion is lower than that in a heater upper portion, and for a heater located on a lower side, adjusting the resistance value for the heater respective portions such that the amount of generated heat in a heater upper portion is lower than that in a heater lower portion.

A third invention provides the first invention, wherein the substance which is disposed outside the plurality of heaters, facing the plurality of heaters, is a heat insulating material.

A fourth invention provides the second invention, wherein the substance which is disposed outside the plurality of heaters, facing the plurality of heaters, is a heat insulating material.

A fifth invention provides the first invention, wherein the heat shield is provided around the entire periphery of the crucible.

A sixth invention provides the second invention, wherein the heat shield is provided around the entire periphery of the crucible.

A seventh invention provides the invention 1 to the invention 6, wherein the material constituting the heat shield contains a graphite fiber material or graphite.

An eighth invention provides the first invention or the second invention, wherein an inside diameter of the heat shield is larger than an outside diameter of the plurality of heaters.

A ninth invention provides a graphite crucible, wherein the application therefor is the semiconductor single crystal manufacturing apparatus of claim 1 in which a heat shield is provided outside the crucible.

Effects of the Invention

According to the first invention, a heat shield is provided in the space between a substance which is disposed outside the plurality of heaters, facing the plurality of heaters, and the crucible, or in the vicinity of that space, thus the directionality (directivity) of the heat radiated from the heater can be enhanced, and the heating region for the heater can be localized. In addition, the respective heaters are independently supplied with electric power, and the heat shield is provided in a location in the vicinity of the area where the amount of generated heat is relatively low among the generated heat distribution by all the heaters, thus the directivity of heat radiation in a prescribed region for the heater can be enhanced. Whereby, the temperature distribution in the crucible and the melt in the crucible (the "temperature distribution in crucible" can be actively provided.

According to the second invention, in addition to the effects of the first invention, as shown in FIG. 10, the heat shield is provided substantially in the central portion in the vicinity of the heater outside periphery in the intermediate area where the amount of generated heat in the heater is relatively low, thus the upper area of the crucible can be heated to a high temperature by the side upper-stage heater, while the lower area of the crucible can be heated to a high temperature by the side lower-stage heater, and the heat shield is provided, whereby the directivity of the heat radiation for the side upper- and lower-stage heaters can be enhanced, thus the temperature distribution in crucible can be actively provided.

According to the third invention and the fourth invention, the substance which is disposed outside the plurality of heaters, facing the plurality of heaters, is a heat insulating material, thus the heat radiated from the heater can be effectively insulated.

According to the fifth invention and the sixth invention, in FIG. 1, for example, heat shields 20, 21 are provided around the entire periphery of the crucible 3, thus the heat shield effect can be sufficiently exerted.

According to the seventh invention, the material used for the heat shield has high thermal insulation properties, and is thermally stable, thus the mutual thermal interference between adjacent heaters can be effectively suppressed, and the contamination of the single crystal can be avoided.

According to the eighth invention, the inside periphery diameter of the heat shield is larger than the outside diameter of the plurality of heaters, thus, in FIG. 4, for example, the heat shields 22, 23 can be easily mounted to and removed from the inside of the chamber 2, and further the possibility that the heat shield is contacted with the heater having a high voltage to be energized thereby, or an abnormal discharge is caused across both can be eliminated.

According to the ninth invention, the application for the graphite crucible is the semiconductor single crystal manufacturing apparatus of the first invention in which a heat shield is provided outside the graphite crucible, thus the temperature distribution in crucible for the graphite crucible can be effectively controlled.

EXPLANATION OF REFERENCE NUMERALS AND SIGNS IN THE DRAWINGS

Figure 1:
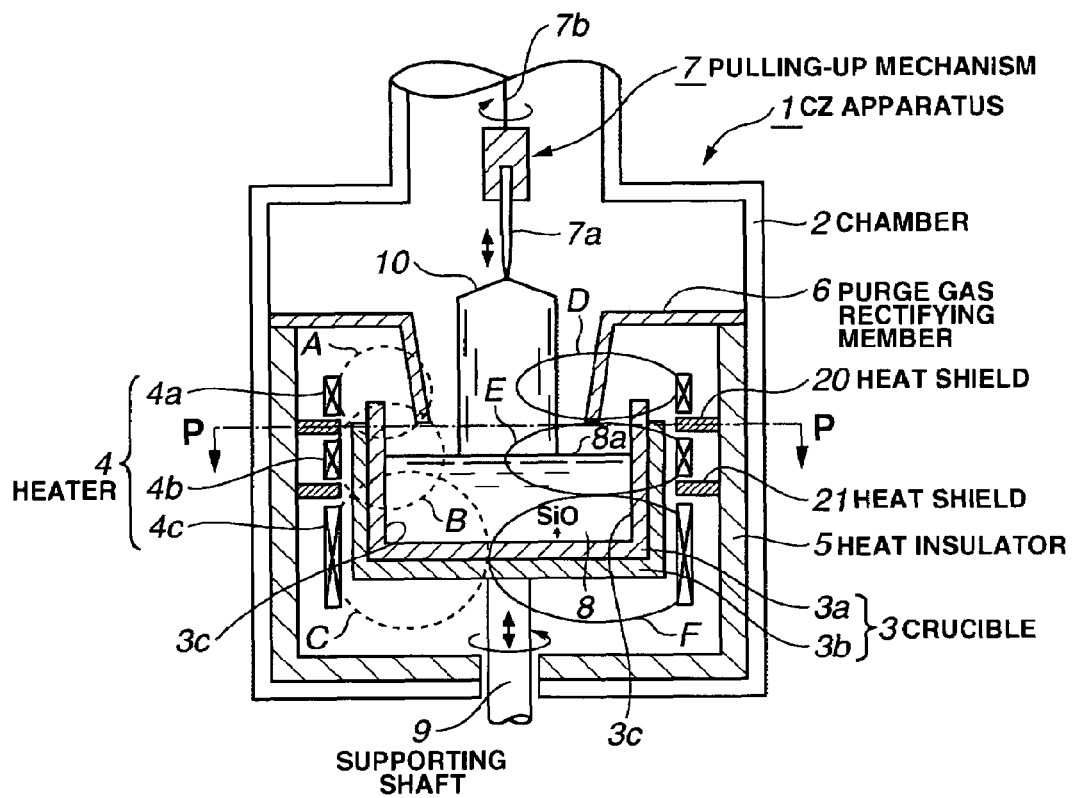
FIG. 1 is a conceptual drawing for illustrating an embodiment of the present invention.

A to C, H, J: Heating region for a heater in the conventional apparatus
D to F, G, I: Heating region for a heater in the apparatus of the present invention
G1 to G4: Direction of flow of purge gas
1: CZ apparatus
2: Chamber
3: Crucible
3a: Quartz crucible
3b: Graphite crucible
3c: Contact surface
4: Side heater
5: Heat insulator
M6: Purge gas rectifying member
7: Pulling-up mechanism
8: Silicon melt
9: Supporting shaft
10: Silicon single crystal
14: Bottom heater
20 to 25, 80, 100: Heat shield
20a: Heat shield block

BEST MODE FOR CARRYING OUT THE INVENTION

Hereinbelow, a semiconductor single crystal manufacturing apparatus and a graphite crucible pertaining to the present invention will be described with reference to the drawings.

First Embodiment

FIG. 1 is a sectional view of the semiconductor single crystal manufacturing apparatus for illustrating First Embodiment of the present invention.

CZ apparatus 1 essentially include a crucible 3 disposed in a chamber 2, side heater 4 provided around the outside periphery of the crucible 3, a heat insulator 5 provided around the outside periphery of the side heater 4, a purge gas rectifying member 6 disposed in the vicinity of the crucible 3, and a single crystal pulling-up mechanism 7.

The crucible 3 is of double structure, including a quartz ($SiO_2$) crucible 3a for pooling silicon melt 8 inside thereof, and a graphite (carbon) crucible 3b which is analogous in shape to the quartz crucible 3a, being fitted thereonto. The melt 8 is in contact with the inside surface of the quartz crucible 3a at a contact surface 3c. In addition, the bottom of the crucible 3 is supported by a supporting shaft 9 which is rotatable and elevatable, whereby the crucible 3 can be rotated to cause forced convection of the melt 8, and maintain a melt surface 8a at a substantially identical level during the manufacture of a silicon single crystal 10.

The side heater 4 comprise three heaters; an upper heater 4a, an intermediate heater 4b, and a lower heater 4c. The respective heaters are cylindrical graphite heaters which are all provided with an identical inside diameter and outside diameter, and a prescribed wall thickness, being disposed around the side of the crucible 3 concentrically with the crucible 3 with a prescribed spacing being kept in the vertical direction. In addition, they are disposed in proximity to the outside periphery side face of the graphite crucible 3b such that the crucible 3 can be efficiently heated.

As the material for the heater for use in the apparatus of the present invention, any material other than graphite may be used, provided that it is electrically conductive, being capable of heating by passing current therethrough, and will not act as a source of pollution generation. For example, a C/C composite (a carbon fiber reinforced carbon composite material) may be used.

The heat insulator 5 prevents the heat generated by the side heater 4 from escaping, and thus serves to efficiently heat the crucible 3, having a structure with a prescribed thickness for covering the inside periphery cylindrical side face of the chamber 2, and the planar bottom thereof.

Around the outside periphery of the side heater 4, a member, such as an exhaust tube for exhausting the introduced purge gas, besides the heat insulator 5 may be disposed. In the following, the case where only the heat insulator 5 is disposed around the outside periphery of the side heater 4 will be first described, and subsequently thereto, the case where a member, such as an exhaust tube, or the like, will be described.

The purge gas rectifying member 6 is rectifies the purge gas introduced from an inert purge gas introducing port (not shown) provided in the upper portion of the chamber 2 above a silicon melt surface 8a.

The single crystal pulling-up mechanism 7 has a pulling-up shaft 7b which is rotatable and elevatable, and a seed crystal 7a can be fixed to the lower end of the shaft.

Up to here, First Embodiment is the same as the conventional semiconductor single crystal manufacturing apparatus using a plurality of heaters, however, in case of First Embodiment, as shown in FIG. 1, a heat shield 20 is provided at a place in the gap between a heater 4a and a heater 4b which are vertically adjacent to each other, and where the heat shield 20 suppresses the mutual thermal interference between the adjacent heaters, and localizes the heating regions for the adjacent heaters. Likewise, a heat shield 21 is provided at a place in the gap between a heater 4b and a heater 4c which are vertically adjacent to each other, and where the heat shield 21 suppresses the mutual thermal interference between the adjacent heaters, and localizes the heating regions for the adjacent heaters.

In other words, in First Embodiment, a heat shield is disposed in all the gaps (two herein) between heaters which are vertically adjacent to each other.

In addition, the heat shields 20, 21 are provided around the entire outside periphery of the crucible 3.

The heat shield 20 is formed in the shape of a ring (cylinder), and the inside diameter thereof is substantially the same as that of the side heater 4, while the outside diameter thereof is substantially the same as the inside diameter of the heat insulator 5. In addition, the thickness (the wall thickness) of the heat shield 20 is set such that the heat shield 20 can be disposed with a prescribed distance that is provided between the lower end of the heater 4a and the top surface of the heat shield 20 and between the upper end of the heater 4b and the bottom surface of the heat shield 20.

Likewise, the heat shield 21 is also formed in the shape of a ring, and the inside and outside diameters thereof are substantially the same as those of the heat shield 20. In addition, the thickness of the heat shield 21 is set such that the heat shield 21 can be disposed with a prescribed distance that is provided between the lower end of the heater 4b and the top surface of the heat shield 21 and between the upper end of the heater 4c and the bottom surface of the heat shield 21.

As the material for the heat shields 20, 21, a material which will not be a source of pollution in a high temperature environment is preferable, and the higher the thermal insulation properties the more preferable the material. As such a material, graphite or graphite fiber material is available, however, a heat shield having a structure which covers the graphite fiber material with graphite is further preferable.

It is desirable that the heat shields 20, 21 be fixed to an internal part in the chamber 2 through a plurality of support rods, or the like, such that the heat shield effect is not reduced. This is also applicable to the other embodiments, and hereinbelow, the explanation about this will be omitted.

Next, the functional effects obtained by disposing the heat shields 20, 21 will be described.

As described in the "Background Art", the plurality of heaters incorporated in the conventional apparatus can independently vary the output thereof, respectively, but the heating regions for the adjacent heaters have caused mutual thermal interference, and the heating regions for the respective heaters could not have been localized for temperature control.

Contrarily to this, in a case of First Embodiment, the heat shields 20, 21 are provided between the adjacent heaters, whereby the mutual thermal interference between heaters is effectively suppressed, thus the heating region for the respective heaters can be sufficiently localized for temperature control.

In order to compare heating region between First Embodiment and the conventional apparatus, the heaters at left side in FIG. 1 schematically show the heating regions for the conventional respective heaters (with broken lines A, B, C), while the heaters at right side show the heating regions for the respective heaters of the present invention (with solid lines D, E, F). Herein, it is assumed that the corresponding respective heaters at left and right sides have the same output.

In a case of the conventional apparatus, in the sectional view in FIG. 1, no heat shield is provided in the gap between the respective heaters or in the vicinity of that gap, thus the heat radiation from the respective heaters takes a circular form, the overlapping portion between the heating regions for the adjacent heaters being large. Contrarily, in a case of First Embodiment, the heat shields 20, 21 are disposed, whereby the heat radiation from the respective heaters is provided with a directionality (directivity), which allows the heating region to become localized, and the overlapping portion between the heating regions for the adjacent heaters to become minimized. In other words, in a case of the present embodiment, the heat shields 20, 21 can suppress the mutual thermal interference between adjacent heaters.

Moreover, if the corresponding respective heaters in both apparatuses have the same output, the heater in First Embodiment has a directionality of heat radiation, thus it can provide local heating to a more distant region, as compared to the conventional heater. Therefore, according to First Embodiment, the "temperature distribution in crucible" can be actively controlled over a wider and more distant region, as compared to that with the conventional apparatus.

By using the apparatus of the present invention, the oxygen concentration in the silicon single crystal can be actively controlled over a wide range as follows.

As described above, the oxygen concentration in the silicon single crystal is deeply related to the amount of elution of the SiO which has been eluted into the melt and the manner of transportation of the eluted oxygen to the growth interface of the single crystal.

Then, in order to taken in as large an amount of the eluted oxygen as possible into the growth interface of the single crystal by using the apparatus of the present embodiment, the following schemes can be employed in consideration of the contact surface area at the crucible bottom being large, and the growth interface of the single crystal 10 to be pulled up and grown being in the middle of the melt surface 8a.

In other words, the crucible bottom and the melt in the vicinity thereof are locally heated for promoting the reaction between the quartz ($SiO_2$) of the crucible material and the melt of silicon (Si) at the contact surface in the vicinity of the crucible bottom for giving a more amount of eluted oxygen. At the same time, the output of the respective heaters is adjusted to provide a prescribed temperature distribution for the crucible and the melt in the crucible for forming a thermal convection which rapidly transports the eluted oxygen from the contact surface of the crucible bottom to the growth interface of the single crystal 10 instead of allowing it to be dissipated as an evaporant.

Inversely, in order to minimize the oxygen concentration in the single crystal, the output of the respective heaters can be adjusted to suppress the oxygen elution from the crucible bottom, and to form a thermal convection which dissipates as much eluted oxygen from the contact surface as possible as an evaporant for decreasing the oxygen concentration in melt, and at the same time to prevent the eluted oxygen from being rapidly transported to the growth interface of the single crystal.

Figure 2:
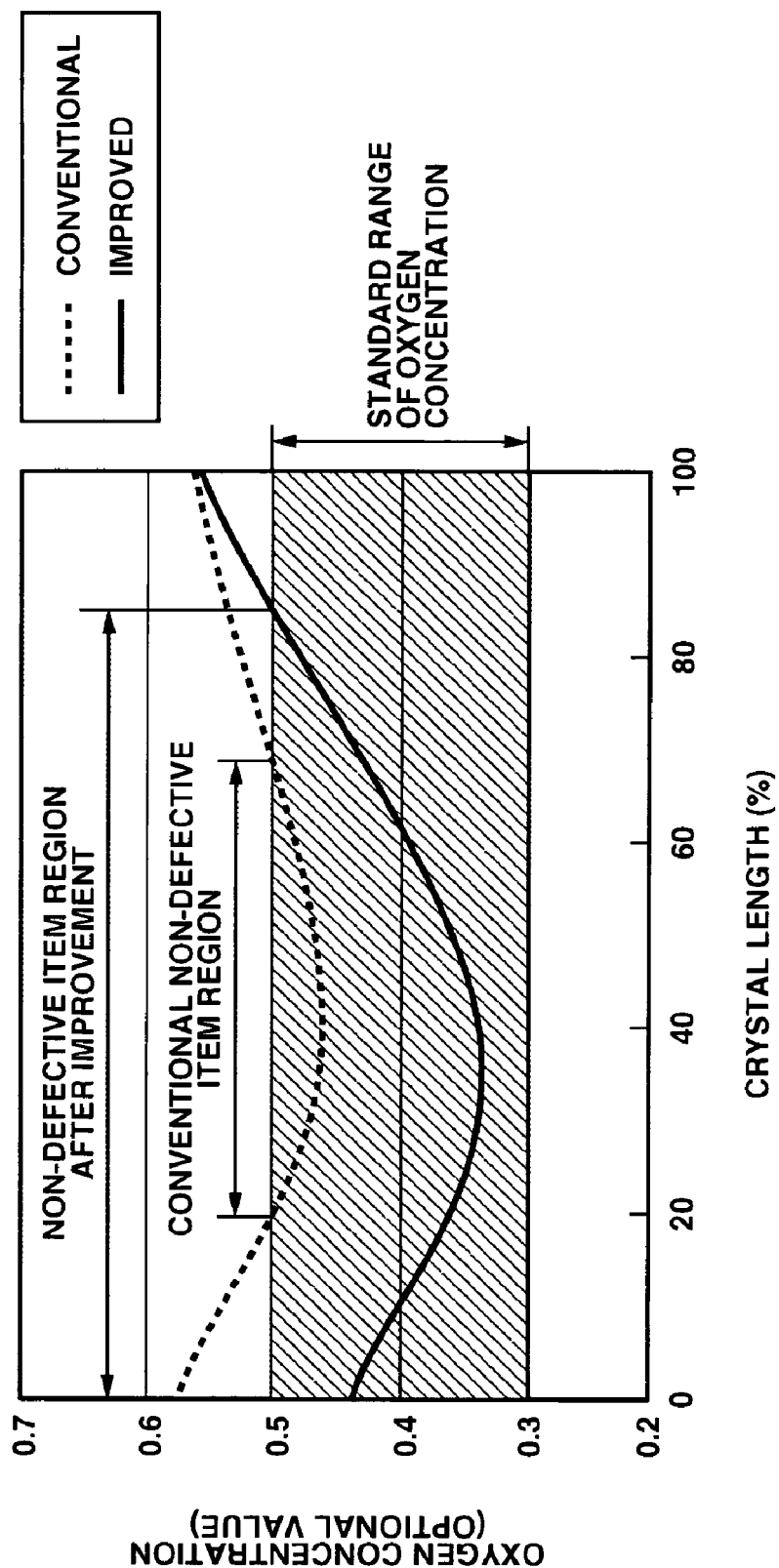
FIG. 2 is a diagram illustrating results of comparative experiment of oxygen concentrations on the lower oxygen side between an apparatus of the present invention and a conventional apparatus.

FIG. 2 shows the results of the experiment for comparison between the oxygen concentrations of the silicon single crystal on the lower oxygen side according to the apparatus in First Embodiment as described above and the conventional apparatus.

In FIG. 2, the abscissa expresses the crystal length (the solidification rate) of the pulled up single crystal from the initial stage of growth (0%) to the end of growth (100%), and the ordinate expresses the oxygen concentration (an optional value) in the single crystal. The shaded area expresses the standard range of oxygen concentration in the silicon single crystal that is used for low oxygen concentration wafers, the single crystal portion in this range providing a non-defective item. The solid line represents the improved data according to First Embodiment, and the broken line the conventional data according to the conventional apparatus.

As shown in FIG. 2, the conventional apparatus provides a high limiting point on the lower oxygen side, thus the oxygen concentration in the single crystal at the initial stage of growth cannot be held to within the standard range, and when the crystal length has reached approx. 20%, a non-defective item portion is barely obtained. In addition, at the time when the crystal length has reached approx. 70%, the oxygen concentration rises back, and an item produced in this portion thereafter becomes defective.

On the other hand, with the apparatus in First Embodiment, the limiting point on the lower oxygen side can be lowered, compared to that with the conventional apparatus as described above, thus the single crystal provides a non-defective item from the initial stage of growth, and the oxygen concentration is held to within the standard range until the crystal length reaches approx. 85%. As a result of this, the yield rate is improved by approx. 35%.

Figure 3:
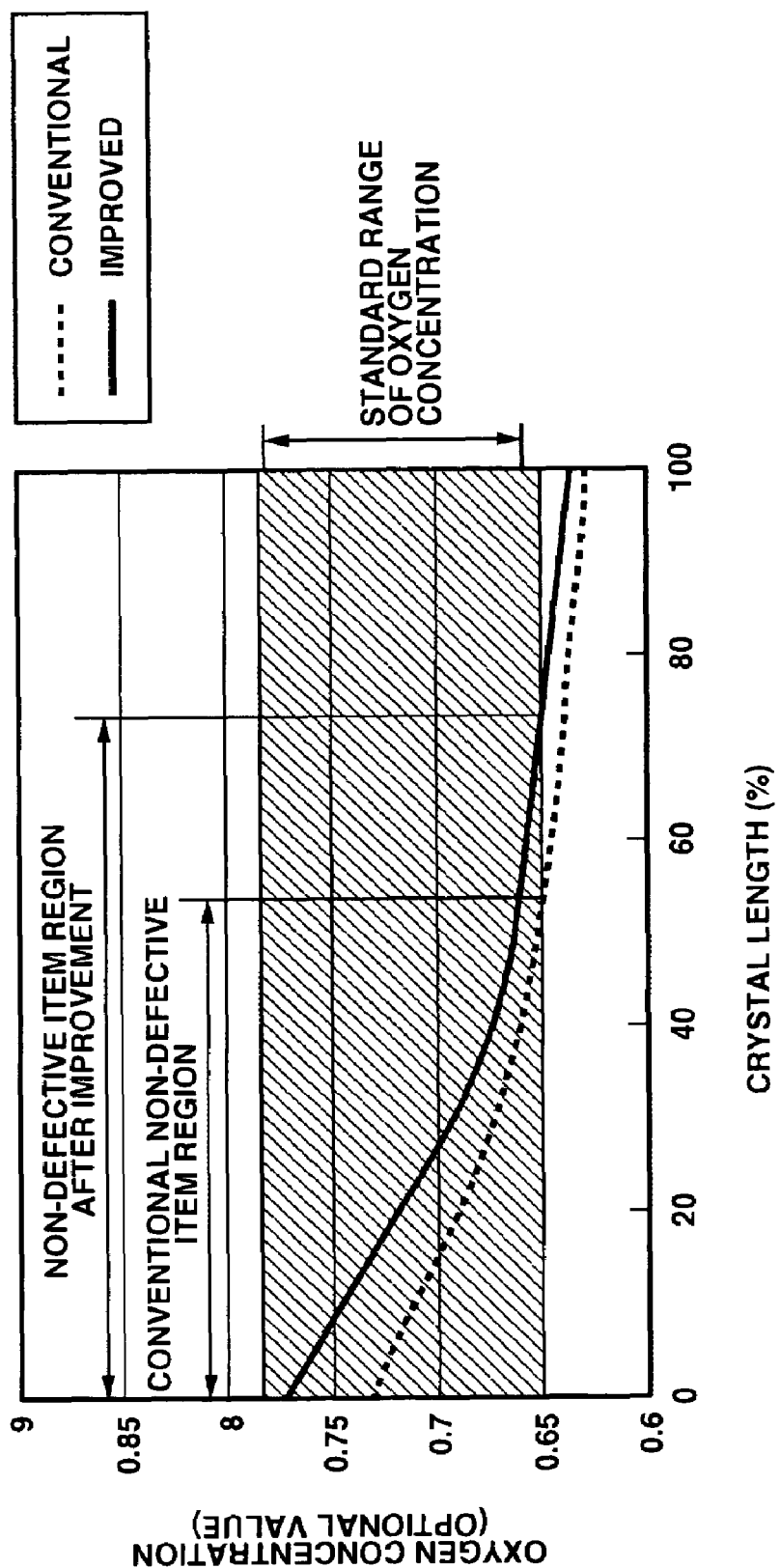
FIG. 3 is a diagram illustrating results of comparative experiment of oxygen concentrations on the higher oxygen side between the apparatus of the present invention and the conventional apparatus.

FIG. 3 shows the results of the experiment for comparison between the oxygen concentrations of the silicon single crystal on the higher oxygen side according to the apparatus in First Embodiment and the conventional apparatus.

As shown in FIG. 3, the conventional apparatus provides a low limiting point on the higher oxygen side, thus the pulled-up silicon single crystal is non-defective at the initial stage of growth, but because the oxygen concentration in the melt in the crucible tends to decrease as the crystal grows, it is off the standard range of oxygen concentration when the crystal length is at approx. 55%, and an item produced in the portion thereafter becomes a defective item.

On the other hand, with the apparatus in First Embodiment, the limiting point on the higher oxygen side can be raised, compared to that with the conventional apparatus, by the method described above, thus the range from the initial stage of growth to a crystal length of approx. 73% provides a non-defective item, the yield rate being improved by approx. 18%.

Thus, according to the apparatus in First Embodiment, the silicon single crystal can be manufactured with the yield being substantially improved, whether it is a high oxygen concentration one or a low oxygen concentration one, as compared to that with the conventional apparatus. In addition, a silicon single crystal having a high oxygen concentration or a low oxygen concentration which could not have been provided by the conventional apparatus can be manufactured.

A silicon single crystal having a desired oxygen concentration falling between the high oxygen concentration range and the low oxygen concentration range can be manufactured by appropriately adjusting the temperature distribution for the crucible and the melt in the crucible with the use of the respective heaters which can provide the above-mentioned local heating.

With the apparatus in First Embodiment, the heating region for a specific heater can be localized, thus the heating control which is more efficient than with the conventional apparatus can be performed, which offers another advantage that the power consumption required for silicon single crystal manufacture can be reduced.

Second Embodiment

Figure 4:
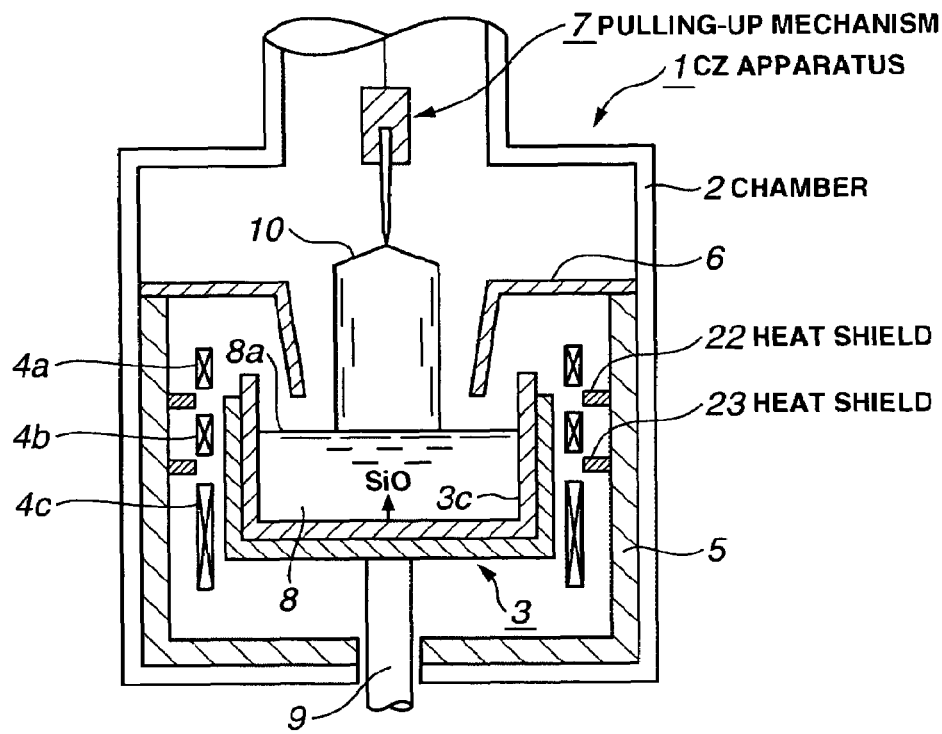
FIG. 4 is a conceptual drawing for illustrating another embodiment of the present invention.

FIG. 4 is a conceptual drawing for illustrating another embodiment of the present invention.

In FIG. 4, a CZ apparatus 1 in Second Embodiment is provided with a structure incorporating a crucible 3, side heater 4 (an upper heater 4a, an intermediate heater 4b, and a lower heater 4c), a heat insulator 5, and the like, in the inside of a chamber 2. As with the CZ apparatus 1 in First Embodiment, and for the components common to those in FIG. 1, the same numerals are provided. Hereinbelow, explanation of them is omitted, and the components other than them will be described in detail.

In a case of Second Embodiment, a heat shield 22 is provided at a place in the vicinity of a gap between the heater 4a and the heater 4b which are vertically adjacent to each other, and where the heat shield 22 suppresses the mutual thermal interference between the adjacent heaters, and localizes the heating regions for the adjacent heaters. Likewise, a heat shield 23 is provided at a place in the vicinity of a gap between the heater 4b and the heater 4c which are vertically adjacent to each other, and where the heat shield 23 suppresses the mutual thermal interference between the adjacent heaters, and localizes the heating regions for the adjacent heaters.

The heat shields 22, 23 are formed in the shape of a ring (cylinder), and the inside diameters of them are substantially the same as the outside diameter of the side heater 4, while the outside diameters of them are substantially the same as the inside diameter of the heat insulator 5. In addition, the thickness (wall thickness) of each of the heat shields 22, 23 is set at the same thickness of each of the heat shields 20, 21 in First Embodiment, respectively. The inside diameter of the heat shields 22, 23 may be adapted to be larger than the outside diameter of the side heater 4 in order to eliminate the possibility of the heat shields 22, 23 being contacted with the side heater 4, or the thickness of each of the heat shields 22, 23 may be adapted to be larger than that of the heat shields 20, 21 in First Embodiment.

By providing the above-mentioned structure, the effect of suppressing the mutual thermal interference between the adjacent heaters is somewhat lowered when compared to that in First Embodiment, however, the heating region for the respective heaters can be sufficiently localized as compared to that in the conventional apparatus.

In addition, in Second Embodiment, the heat shields 22, 23 can be easily mounted to and removed from the inside of the chamber 2 as compared to that in First Embodiment, and further the possibility that the heat shield is contacted with the heater having a high voltage to be energized thereby, or an abnormal discharge is caused across both can be advantageously eliminated.

Third Embodiment

Figure 5:
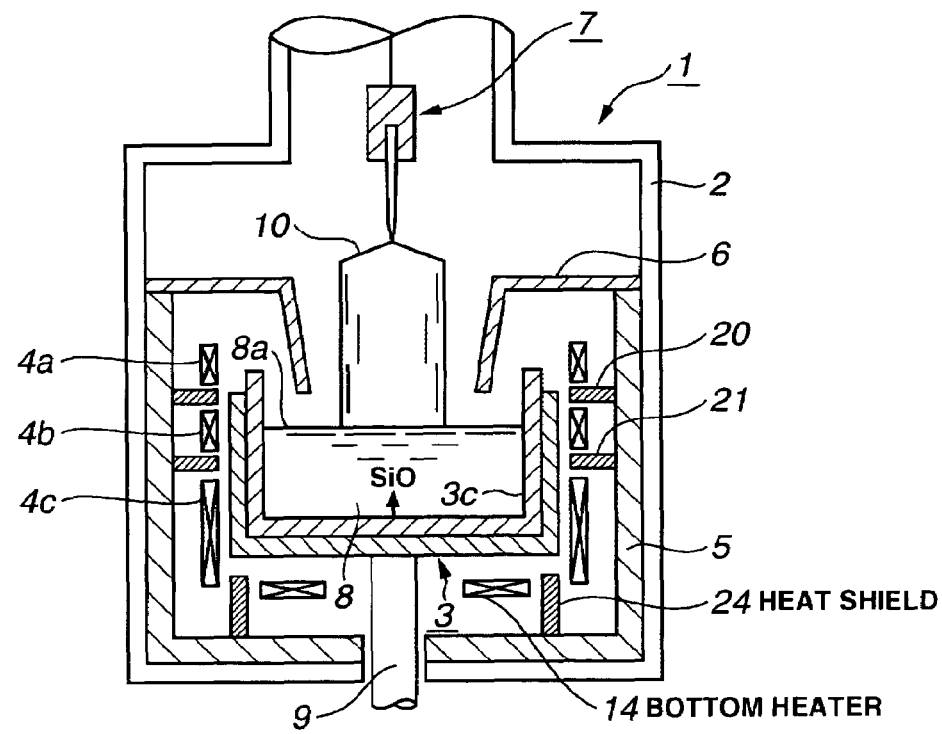
FIG. 5 is a conceptual drawing for illustrating still another embodiment of the present invention.

FIG. 5 is a conceptual drawing for illustrating still another embodiment of the present invention.

A CZ apparatus 1 in Third Embodiment is provided with a structure incorporating a crucible 3, side heater 4 (an upper heater 4a, an intermediate heater 4b, and a lower heater 4c), a heat insulator 5, and the like, in the inside of a chamber 2, as with the CZ apparatus 1 in First Embodiment. And for the components common to those in FIG. 1, the same numerals are provided. Hereinbelow, explanation of them is omitted, and the components other than them will be described in detail.

In a case of Third Embodiment, a bottom heater 14 is provided together with a side heater at a place under the lower heater 4c around a supporting shaft 9 in concentricity therewith. In addition, together with heat shields 20, 21, which have been explained in First Embodiment, a heat shield 24 is provided in a gap between the lower heater 4c and the bottom heater 14.

The bottom heater 14 is formed in the shape of a ring, being provided with a prescribed thickness, and the inside diameter thereof is larger than the outside diameter of the supporting shaft 9, while the outside diameter thereof is smaller than the inside diameter of the lower heater 4c. The bottom heater 14 is disposed such that the top surface thereof will not interfere with the lower end of the crucible 3 even when the crucible 3 is elevated during manufacture of the silicon single crystal.

The heat shield 24 is formed in the shape of a cylinder, having a prescribed length, and the inside diameter is larger than the outside diameter of the bottom heater 14, while the outside diameter is smaller than the inside diameter of the lower heater 4c. The heat shield 24 thus formed is vertically disposed substantially to the level of the top surface of the bottom heater 14, being contacted with the bottom surface of the heat insulator 5, in a gap between the lower heater 4c and the bottom heater 14.

By providing the configuration as described above, the mutual thermal interference between the lower heater 4c and the bottom heater 14 is suppressed, which allows the bottom of the crucible 3 to be locally heated by the bottom heater 14. Therefore, the "temperature distribution in crucible" can be further actively controlled, which further facilitates manufacturing of a silicon single crystal with the oxygen concentration therefor being held to within a prescribed range.

Fourth Embodiment

Figure 6:
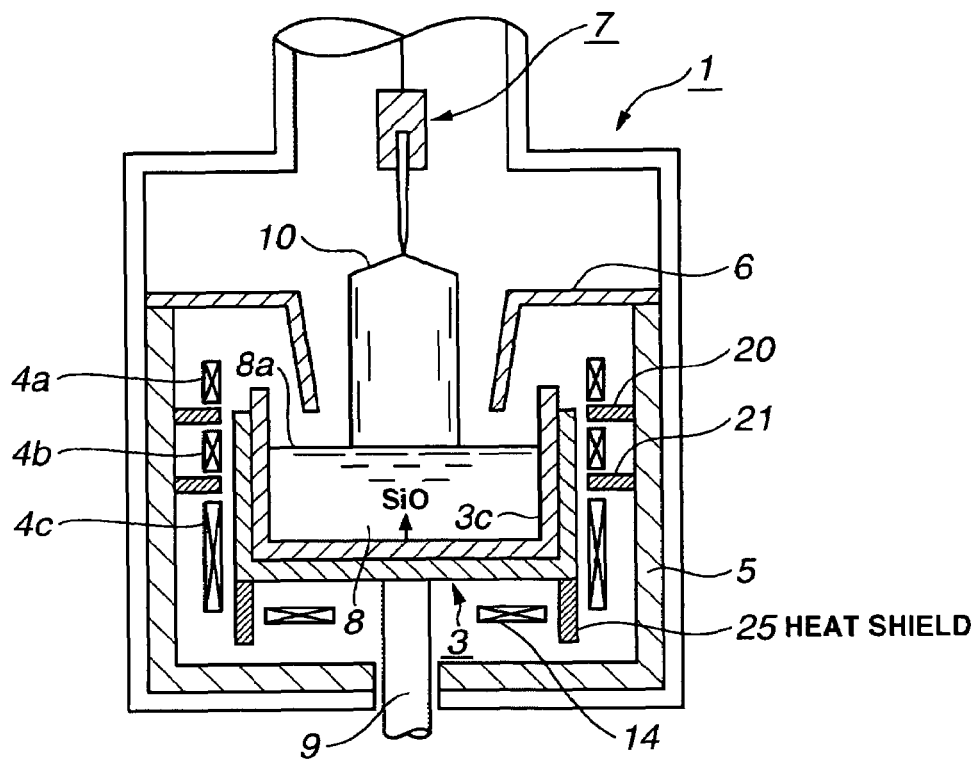
FIG. 6 is a conceptual drawing for illustrating another embodiment of the present invention.

FIG. 6 is a conceptual drawing for illustrating another embodiment of the present invention.

A CZ apparatus 1 in Fourth Embodiment is provided with a structure incorporating a crucible 3, a side heater 4, a heat insulator 5, and the like, in the inside of a chamber 2, as with the CZ apparatus 1 in FIG. 1. And for the components common to those in FIG. 1, the same numerals are provided. Hereinbelow, explanation of them is omitted, and the components other than them will be described in detail.

As in Third Embodiment, the apparatus in Fourth Embodiment is provided with a bottom heater 14 together with side heater 4 (an upper heater 4a, an intermediate heater 4b, and a lower heater 4c) at a place under the lower heater 4c. In addition, together with heat shields 20, 21, which have been explained in First Embodiment, a heat shield 25 is provided in a gap between the lower heater 4c and the bottom heater 14.

The bottom heater 14 is formed in the shape of a ring, being provided with a prescribed thickness, as in Third Embodiment, and the inside diameter thereof is larger than the outside diameter of a supporting shaft 9, while the outside diameter thereof is smaller than the inside diameter of the side heater 4. In addition, the bottom heater 14 is disposed such that the top surface thereof will not interfere with the lower end of the crucible 3 even when the crucible 3 is elevated during manufacture of the silicon single crystal.

The heat shield 25 is formed in the shape of a cylinder, having a prescribed length, and the inside diameter is larger than the outside diameter of the bottom heater 14, while the outside diameter is smaller than the inside diameter of the side heater 4. The heat shield 25 thus formed is suspended from the crucible 3 with the upper end of the cylinder thereof being contacted with the lower end peripheral edge portion of the crucible 3, and the lower end of the cylinder thereof being placed as if it surrounded the outside periphery of the bottom heater 14, in a gap between the lower heater 4c and the bottom heater 14.

By providing the configuration as described above, substantially the same effects as in Third Embodiment are obtained.

The heat shields 24, 25 need not be always limited to a cylindrical one, but may be provided with a hexagonal geometry, for example.

Through First Embodiment to Fourth Embodiment, a mode in which the side heater 4 are composed of three components has been explained, however, the number of side heater components may be two, or four or more.

In addition, in all of Embodiments, a heat shield has been provided in the gap between any two adjacent heaters or in the vicinity of that gap. However, the present invention is not limited to this scheme, but in consideration of the equipment cost, the ease of maintenance, and the like, a heat shield may be disposed in the gap between optionally selected two adjacent heaters or in the vicinity of that gap. For example, in FIG. 1, it is exemplarily possible that the heat shield 20 is removed, and only the heat shield 21 is left disposed. In addition, in FIG. 5, the apparatus may be adapted to have only the heat shields 21, 24 as the heat shield with the heat shield 20 being not provided.

By the way, any of the above-mentioned heat shields has been explained on the assumption that it is an integral structure, however, the heat shield of the present invention may be disposed, being divided along the periphery of the crucible 3.

Figure 7:
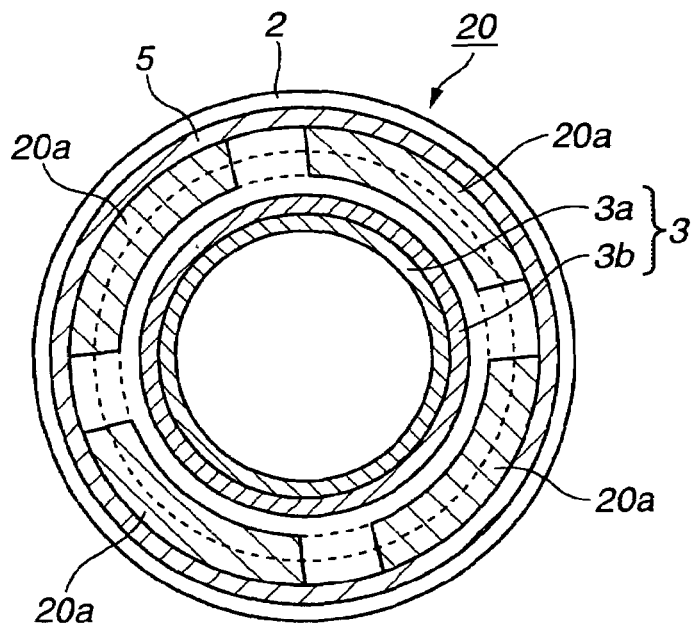
FIG. 7 is a conceptual cross-sectional view for illustrating heat shields using heat shield blocks of the present invention.

FIG. 7 shows a cross-sectional view along line P-P in FIG. 1 as an example thereof, in which, around the periphery of the crucible 3, four heat shield blocks are disposed to compose a heat shield.

In the same figure, the heat shield blocks 20a have the same geometry, being disposed equally spaced.

Particularly, in a case where an exhaust tube, or the like, is provided around the outside periphery of the heater 4, the heat shield can be appropriately divided and disposed for avoiding contact with the exhaust tube, or the like.

Even if the heat shield blocks as a result of such a division are provided, the crucible 3 is rotated at a prescribed speed during manufacture of a single crystal, the thermal non-uniformity can be sufficiently alleviated, and the mutual thermal interference between adjacent heaters can be suppressed, which is the aim of the present invention. The geometry, number of divisions, mutual spacing, and the like for the heat shield blocks can be appropriately determined in accordance with the geometry of the exhaust tube, or the like, and the single crystal manufacturing conditions.

Advantages of using the heat shield blocks include that machining and formation are easier as compared to those for an integral counterpart, and that loading into the chamber and maintenance can be performed more easily.

Depending upon the situation, a portion of the exhaust tube, or the like, may be provided with a heat shield.

Fifth Embodiment

In order to effectively separate the heat radiation from adjacent heaters, the heat shield is preferably disposed in an area where the amount of generated heat in the heaters is relatively low. Then, for controlling the oxygen concentration in the single crystal over a wide range, it is preferable that a higher amount of electric power (generated heat) be provided for the upper and lower areas of the heater 4, while the intermediate area of the heater 4 be provided with a lower amount of electric power (generated heat), and in the intermediate area where the amount of generated heat is relatively low, the heat shield is disposed. The heat shield need not always be provided for the central portion of the heater 4, and depending upon the required quality for the single crystal, the location of the heat shield can be appropriately determined.

Figure 8:
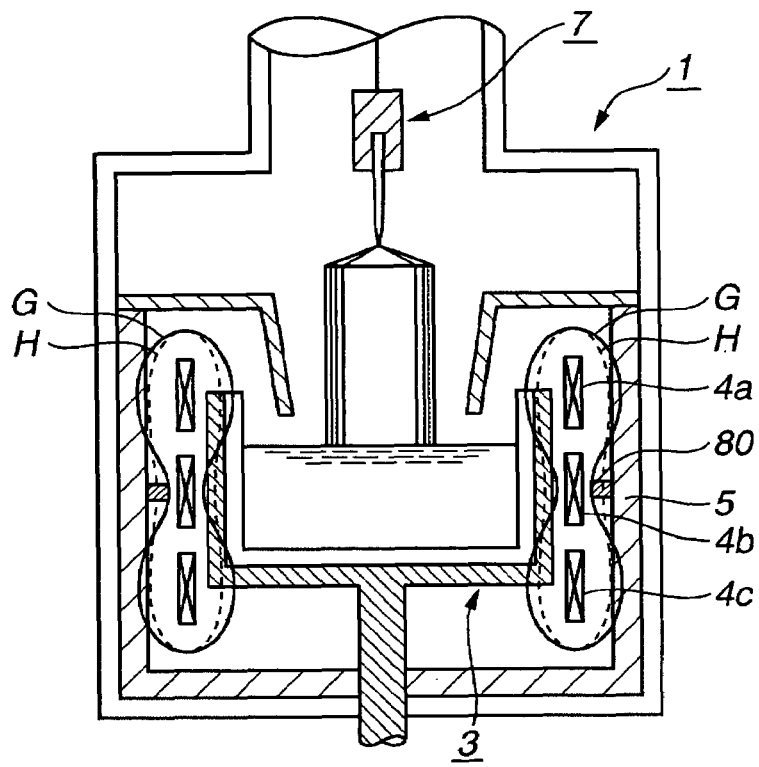
FIG. 8 is a conceptual drawing for illustrating another embodiment of the present invention.

FIG. 8 is a conceptual sectional drawing for illustrating another embodiment to which the heat shield of the present application invention is applied.

In Fifth Embodiment, as shown in FIG. 8, a heat shield 80 is disposed substantially in the central portion of the space constituted by the inside surface of the heat insulating material 5 and the outside surface of the side heater 4, being provided with a prescribed distance from the outside surface of the heater. In addition, the side heater 4 comprises vertically arranged three components (an upper heater 4a, an intermediate heater 4b, and a lower heater 4c). In FIG. 8, a ring-shaped bottom heater (not shown) may be provided at a level further lower than the lower heater 4c and under the bottom of the crucible 3.

As described below, the heat shield 80 is disposed in an area where the amount of generated heat is comparatively low in view of the entire heater.

Figure 9:
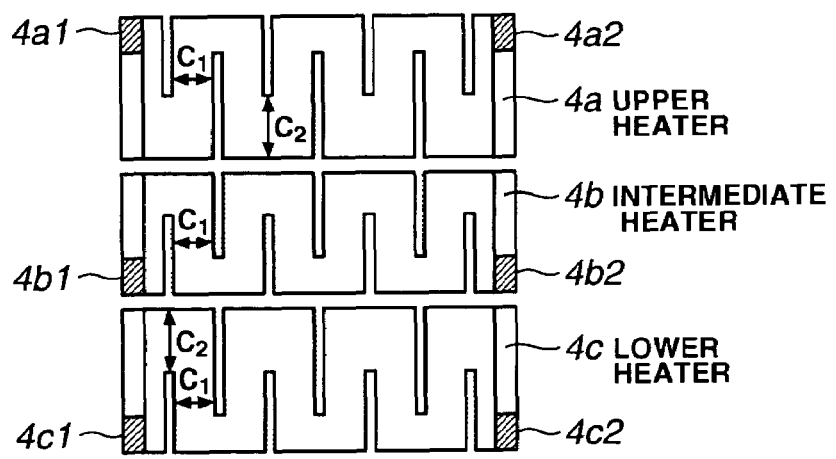
FIG. 9 is a conceptual drawing for illustrating a heater structure in another embodiment of the present invention.

FIG. 9 is a development view in which the upper heater 4a, the intermediate heater 4b, and the lower heater 4c are developed, showing a configuration of the side heater 4 applied to Fifth Embodiment.

As shown in FIG. 9, the respective heaters are independently supplied with electric power, being constituted by a conductor which generates heat when energized. For each of the heaters, an independent power supply is provided.

In other words, the respective heaters 4a, 4b, 4c are equipped with a positive electrode 4a1, 4b1, 4c1, and a negative (ground) electrode 4a2, 4b2, 4c2. By independently adjusting the voltages applied to the respective heaters 4a, 4b, 4c, the amounts of heat generation, in other words, the amounts of heating the crucible 3 can be separately adjusted.

With the voltage of the power supply for the upper heater 4a being applied across the positive electrode 4a1 and the negative electrode 4a2 for the heater 4a, an electric current flows through the upper heater 4a, resulting in heat being generated. By changing the voltage of the power supply for the upper heater 4a, the amount of generated heat in the upper heater 4a is adjusted, resulting in the amount of heating for the upper portion of the crucible 3 being controlled.

In addition, with the voltage of the power supply for the intermediate heater 4b being applied across the positive electrode 4b1 and the negative electrode 4b2 for the heater 4b, an electric current flows through the intermediate heater 4b, resulting in heat being generated. By changing the voltage of the power supply for the middle stage heater, the amount of generated heat in the intermediate heater 4b is adjusted, resulting in the amount of heating for the middle portion of the crucible 3 being controlled.

In addition, with the voltage of the power supply for the lower heater 4c being applied across the positive electrode 4c1 and the negative electrode 4c2 for the heater 4c, an electric current flows through the lower heater 4c, resulting in heat being generated. By changing the voltage of the power supply for the lower heater 4c, the amount of generated heat in the lower heater 4c is adjusted, resulting in the amount of heating for the lower portion of the crucible 3 being controlled.

For the upper heater 4a, the width of the current flow path is adapted such that the width c2 in the heater lower portion is larger than the width c1 in the heater upper portion. Thereby, for the upper heater 4a, the heater lower portion is wider than the heater upper portion in cross sectional area for current passing, and thus the resistance value for the heater lower portion is lower than that for the heater upper portion, resulting in the amount of generated heat in the heater lower portion being lower than that in the heater upper portion.

On the other hand, for the lower heater 4c, the width of the current flow path is adapted such that the width c2 in the heater upper portion is larger than the width c1 in the heater lower portion. Thereby, for the lower heater 4c, the heater upper portion is wider than the heater lower portion in cross sectional area for current passing, and thus the resistance value for the heater upper portion is lower than that for the heater lower portion, resulting in the amount of generated heat in the heater upper portion being lower than that in the heater lower portion.

Contrarily to this, for the intermediate heater 4b, the width of the current flow path is adapted such that the same width c1 is provided in the heater respective portions. Alternatively, in order to reduce the amount of generated heat in the intermediate heater 4b, as compared to that in the upper heater 4a and the lower heater 4c, the width of the current flow path for the intermediate heater 4b may be equal to or larger than the maximum width (c2) of the current flow path for the upper heater 4a and the lower heater 4c.

The above-mentioned upper heater 4a, the intermediate heater 4b, and the lower heater 4c can be independently controlled for the amount of generated heat, respectively, thus for example, the amount of generated heat in the intermediate heater 4b can be controlled such that it is lower than the amount of generated heat in the upper heater 4a and the lower heater 4c.

In Fifth Embodiment, as shown in FIG. 8, the heat shield 80 is disposed in the vicinity of the outside of the substantially central portion of the intermediate heater 4b which is controlled such that the amount of generated heat therein is relatively lower, when compared to that in the upper heater 4a and the lower heater 4c.

In Fifth Embodiment, the width c of the current flow path for the heater respective portions is changed for changing the amount of generated heat in the heater respective portions, however, for example, by changing the wall thickness of the current flow path for the heater respective portions with the width c of the current flow path for the heater respective portions being fixed, the amount of generated heat in the heater respective portions may be changed.

In FIG. 8, the heating region according to Fifth Embodiment (the solid line G) and the heating region according to the conventional three-stage heater (the broken line H) are shown. In a case where the conventional three-stage heater is used, the heating region is not sufficiently separated in the central stage heater area, while, in a case of Fifth Embodiment, the heating region along the vertical direction for the heater 4 is sufficiently separated in the central stage heater area, and the heating regions for the upper and the lower areas of the heater 4 can be provided with a directionality.

As described above, according to Fifth Embodiment, the heat shield 80 is disposed in the vicinity of the outside peripheral surface of the intermediate heater 4b, whereby the directionality of heat radiation for the upper heater 4a and the lower heater 4c can be enhanced. In addition, the amount of generated heat in the upper portion of the upper heater 4a and the lower portion of the lower heater 4c can be made relatively high, thus, for example, by appropriately setting the amount of heat radiation for the intermediate heater 4b, heat radiation which is high in directionality can be provided from the upper area and the lower area of the heater 4 as a whole.

Sixth Embodiment

Figure 10:
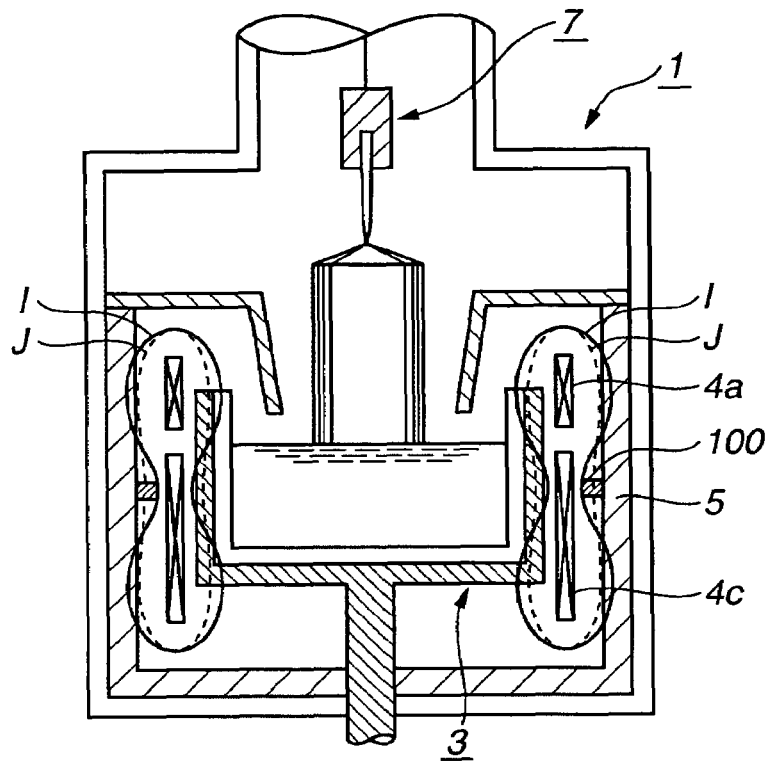
FIG. 10 is a conceptual drawing for illustrating another embodiment of the present invention.

FIG. 10 is a conceptual sectional drawing for illustrating still another embodiment in which the heat shield of the present application invention is used.

In FIG. 10, a heat shield 100 is disposed substantially in the central portion of the space constituted by the inside surface of the heat insulating material 5 and the outside surface of the side heater 4, being provided with a prescribed distance from the surface of the side heater 4. In addition, the heater comprises the side heater 4 vertically arranged two components (an upper heater 4a and a lower heater 4c). In FIG. 10, a ring-shaped bottom heater (not shown) may be provided at a level further lower than the lower heater 4c and under the bottom of the crucible 3.

As described below, the heat shield 100 is disposed in an area where the amount of generated heat is comparatively low in view of the entire heater.

Figure 11:
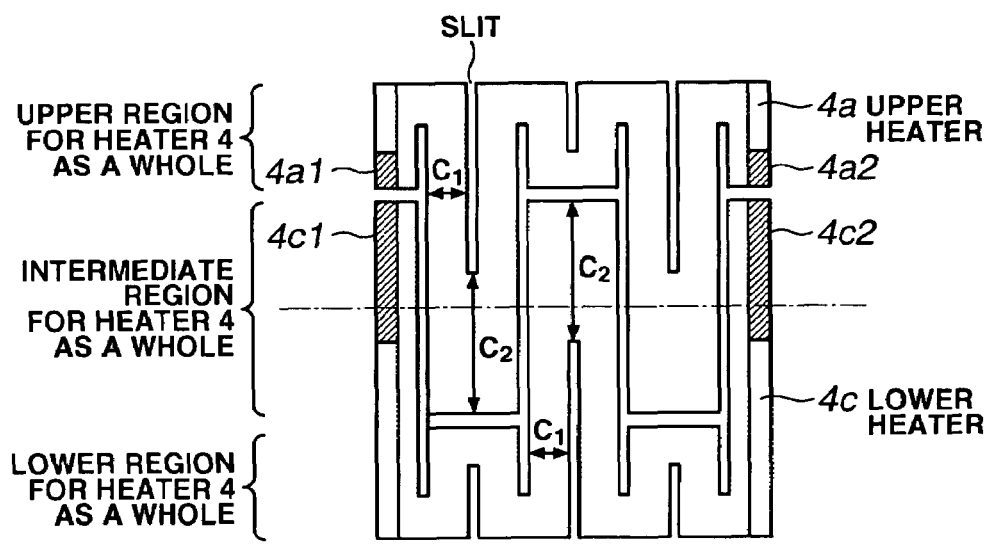
FIG. 11 is a conceptual drawing for illustrating a heater structure in another embodiment of the present invention.

FIG. 11 is a development view in which the upper heater 4a and the lower heater 4c are developed, showing a configuration of the side heater 4 applied to Sixth Embodiment.

As shown in FIG. 11, the respective heaters are independently supplied with electric power, being constituted by a conductor which generates heat when energized. For each of the heaters, an independent power supply is provided.

In other words, the upper heater 4a and the lower heater 4c are independently supplied with electric power, being constituted by a conductor which generates heat when energized. In other words, for each of the respective heaters 4a, 4c, an independent power supply is provided, and the respective heaters 4a, 4c are equipped with a positive electrode 4a1, 4c1, and a negative (ground) electrode 4a2, 4c2. By independently adjusting the voltages applied to the respective heaters 4a, 4c, the amounts of heat generation, in other words, the amounts of heating the crucible 3 can be separately adjusted.

With the voltage of the power supply for the upper heater 4a being applied across the positive electrode 4a1 and the negative electrode 4a2 for the heater 4a, an electric current flows through the upper heater 4a, resulting in heat being generated. By changing the voltage of the power supply for the upper heater 4a, the amount of generated heat in the upper heater 4a is adjusted, resulting in the amount of heating for the upper portion of the crucible 3 being controlled.

In addition, with the voltage of the power supply for the lower heater 4c being applied across the positive electrode 4c1 and the negative electrode 4c2 for the heater 4c, an electric current flows through the lower heater 4c, resulting in heat being generated. By changing the voltage of the power supply for the lower heater 4c, the amount of generated heat in the lower heater 4c is adjusted, resulting in the amount of heating for the lower portion of the crucible 3 being controlled.

In addition, in a case of the heater 4 in Sixth Embodiment, for the upper heater 4a, the width of the current flow path is adapted such that the width c2 in the heater lower portion is larger than the width c1 in the heater upper portion. Thereby, for the upper heater 4a, the heater lower portion is wider than the heater upper portion in cross sectional area for current passing, and thus the resistance value for the heater lower portion is lower than that for the heater upper portion, resulting in the amount of generated heat in the heater lower portion being lower than that in the heater upper portion.

On the other hand, for the lower heater 4c, the width of the current flow path is adapted such that the width c2 in the heater upper portion is larger than the width c1 in the heater lower portion. Thereby, for the lower heater 4c, the heater upper portion is wider than the heater lower portion in cross sectional area for current passing, and thus the resistance value for the heater upper portion is lower than that for the heater lower portion, resulting in the amount of generated heat in the heater upper portion being lower than that in the heater lower portion.

Further, as shown in FIG. 11, the upper heater 4a is formed such that a part of the current flow path of the upper heater 4a intrudes into a lower location than a location equivalent to the upper end of the lower stage heater 4c, while the lower heater 4c is formed such that a part of the current flow path of the lower heater 4c intrudes into a higher location than a location equivalent to the lower end of the upper stage heater 4a.

Thereby, when the upper and the lower heaters 4a, 4c in Sixth Embodiment as shown in FIG. 10 are viewed as a whole, the amount of generated heat in the intermediate area of the heater 4 as a whole is reduced, as compared to the amount of generated heat in the upper area of the heater 4 as a whole and the amount of generated heat in the lower area of the heater 4 as a whole.

In Sixth Embodiment, the heat shield 100 is disposed in the vicinity of the substantially central portion of the intermediate area where the amount of generated heat is relatively low in view of the entire heater 4.

In configuring the heater in Sixth Embodiment as shown in FIG. 11, the number of slits is not limited, and it can be set in accordance with a desired heater resistance value.

In addition, the spacing between current flow paths constituting the heater (the slit width), and the spacing between the upper heater 4a and the lower heater 4c (the upper and lower heater spacing) are preferably set at, for example, 10 to 30 mm or so. If these spacings are widened, the escape of heat from the gap is increased, which makes the effects of the present invention difficult to be obtained, while if these spacings are narrowed down, the possibility of discharging is increased, which may result in the process itself being cancelled.

In FIG. 10, the heating region according to Sixth Embodiment (the solid line I) and the heating region according to the conventional two-stage heater (the broken line J) are shown. In a case where the conventional two-stage heater is used, the heating region is not sufficiently separated in the intermediate area of the side heater 4 as a whole, while, in a case of Sixth Embodiment, the heating region is sufficiently separated in the intermediate area of the side heater 4, and the heating regions for the upper and the lower areas of the side heater 4 can be provided with an enhanced directionality.

As described above, according to Sixth Embodiment, the heat shield 100 is disposed in the vicinity of the intermediate area of the side heater 4, whereby the directionality of heat radiation for the upper heater 4a and the lower heater 4c can be enhanced. In addition, the amount of generated heat in the upper portion of the upper heater 4a and the lower portion of the lower heater 4c can be made relatively high, thus, heat radiation which is high in directionality can be provided from the upper and lower areas of the heater 4 as a whole.

As described above, according to the apparatus of the present invention, a heat shield is provided in a space constituted by a plurality of heaters and a substance facing them, or in the vicinity of that space, thus the heating regions for the heaters can be localized. As a result of this, the "temperature distribution in crucible" can be actively controlled, which allows manufacturing of a single crystal of high oxygen concentration to that of low one within a prescribed standard range of oxygen concentration with a good yield.

In addition, in a case of the apparatus of the present invention, the apparatus reconstruction can be carried out at low cost with no need for particularly changing the chamber, and heating control can be performed with high efficiency by localizing the heating region for a specific heater, thus advantages include that the power consumption required for manufacturing a single crystal can be reduced as compared to that with the conventional apparatus.

Hereinabove, the embodiments which are used for manufacturing a silicon single crystal have been explained, however, the present invention is not limited to this, but it is applicable as well to manufacturing of single crystals of other semiconductors, such as gallium arsenide (GaAs), and the like, so long as no deviation from the spirit of the present invention is caused.

INDUSTRIAL APPLICABILITY

According to the semiconductor single crystal manufacturing apparatus of the present invention, semiconductor single crystals for semiconductor wafer that are required to have a wide range of oxygen concentration and to be held to within a prescribed standard range of oxygen concentration can be inexpensively and stably supplied to the market.

The invention claimed is:

1. A semiconductor single crystal manufacturing apparatus using the Czochralski method comprising a crucible for pooling melt of a raw material of a semiconductor single crystal, and a plurality of heaters vertically disposed outside the crucible for heating and melting the raw material, wherein
    the electric power of each of the heaters is independently controlled, and
    a heat shield is means for defining the temperature distribution by the plurality of heaters.

2. The semiconductor single crystal manufacturing apparatus of claim 1, wherein the heat shield means is provided between the plurality of heaters.

3. The semiconductor single crystal manufacturing apparatus of claim 2, wherein the heat shield means is provided in a location in an area or in the vicinity of the area where an amount of generated heat is relatively low among heat distributions generated by all of the heaters.

4. The semiconductor single crystal manufacturing apparatus of claim 2, wherein
    for a heater located on an upper side, a resistance value for heater respective portions is adjusted such that the amount of generated heat in a heater lower portion is lower than that in a heater upper portion, and
    for a heater located on a lower side, the resistance value for the heater respective portions is adjusted such that the amount of generated heat in a heater upper portion is lower than that in a heater lower portion.

5. The semiconductor single crystal manufacturing apparatus of claim 2, wherein the heat shield means is provided around the entire periphery of the crucible.

6. The semiconductor single crystal manufacturing apparatus of claim 2, wherein the material constituting the heat shield means contains a graphite fiber material or graphite.

7. The semiconductor single crystal manufacturing apparatus of claim 1, wherein the heat shield means is disposed outside the plurality of heaters.

8. The semiconductor single crystal manufacturing apparatus of claim 7, wherein the heat shield means is provided in a location in an area or in the vicinity of the area where an amount of generated heat is relatively low among heat distributions generated by all of the heaters.

9. The semiconductor single crystal manufacturing apparatus of claim 7, wherein
    for a heater located on an upper side, a resistance value for heater respective portions is adjusted such that the amount of generated heat in a heater lower portion is lower than that in a heater upper portion, and
    for a heater located on a lower side, the resistance value for the heater respective portions is adjusted such that the amount of generated heat in a heater upper portion is lower than that in a heater lower portion.

10. The semiconductor single crystal manufacturing apparatus of claim 7, wherein the heat shield means is provided around the entire periphery of the crucible.

11. The semiconductor single crystal manufacturing apparatus of claim 7, wherein the material constituting the heat shield means contains a graphite fiber material or graphite.

* * * * *